United States Patent [19]

Fayfield

[11] 4,217,492
[45] Aug. 12, 1980

[54] MODULAR PHOTOELECTRIC SWITCH

[75] Inventor: Robert W. Fayfield, Excelsior, Minn.

[73] Assignee: Banner Engineering Corp., Minneapolis, Minn.

[21] Appl. No.: 925,163

[22] Filed: Jul. 17, 1978

[51] Int. Cl.$^2$ .............................................. H01R 3/06
[52] U.S. Cl. .................................. 250/239; 339/18 P
[58] Field of Search .................... 339/18 P; 250/239

[56] References Cited

U.S. PATENT DOCUMENTS

| | | |
|---|---|---|
| 3,777,168 | 12/1973 | Sansone . |
| 3,842,257 | 10/1974 | Kohler . |
| 3,842,258 | 10/1974 | Shaw . |
| 3,891,858 | 6/1975 | Schobert . |
| 3,963,301 | 6/1976 | Stark . |
| 3,963,920 | 6/1976 | Palmer . |
| 3,970,350 | 7/1976 | Takahashi ........................ 339/18 P |
| 4,005,288 | 1/1977 | Robillard . |
| 4,020,496 | 4/1977 | Peterson et al. . |
| 4,021,665 | 5/1977 | Haas . |
| 4,068,910 | 1/1978 | Brown et al. ..................... 339/18 P |

*Primary Examiner*—David C. Nelms
*Assistant Examiner*—Darwin R. Hostetter
*Attorney, Agent, or Firm*—Merchant, Gould, Smith, Edell, Welter & Schmidt

[57] ABSTRACT

An industrial scanner including a plurality of discrete modules having sockets or pins arranged in a predetermined pattern, the pins of one module being long enough to pass through the sockets of another module and into the sockets of yet another module.

6 Claims, 12 Drawing Figures

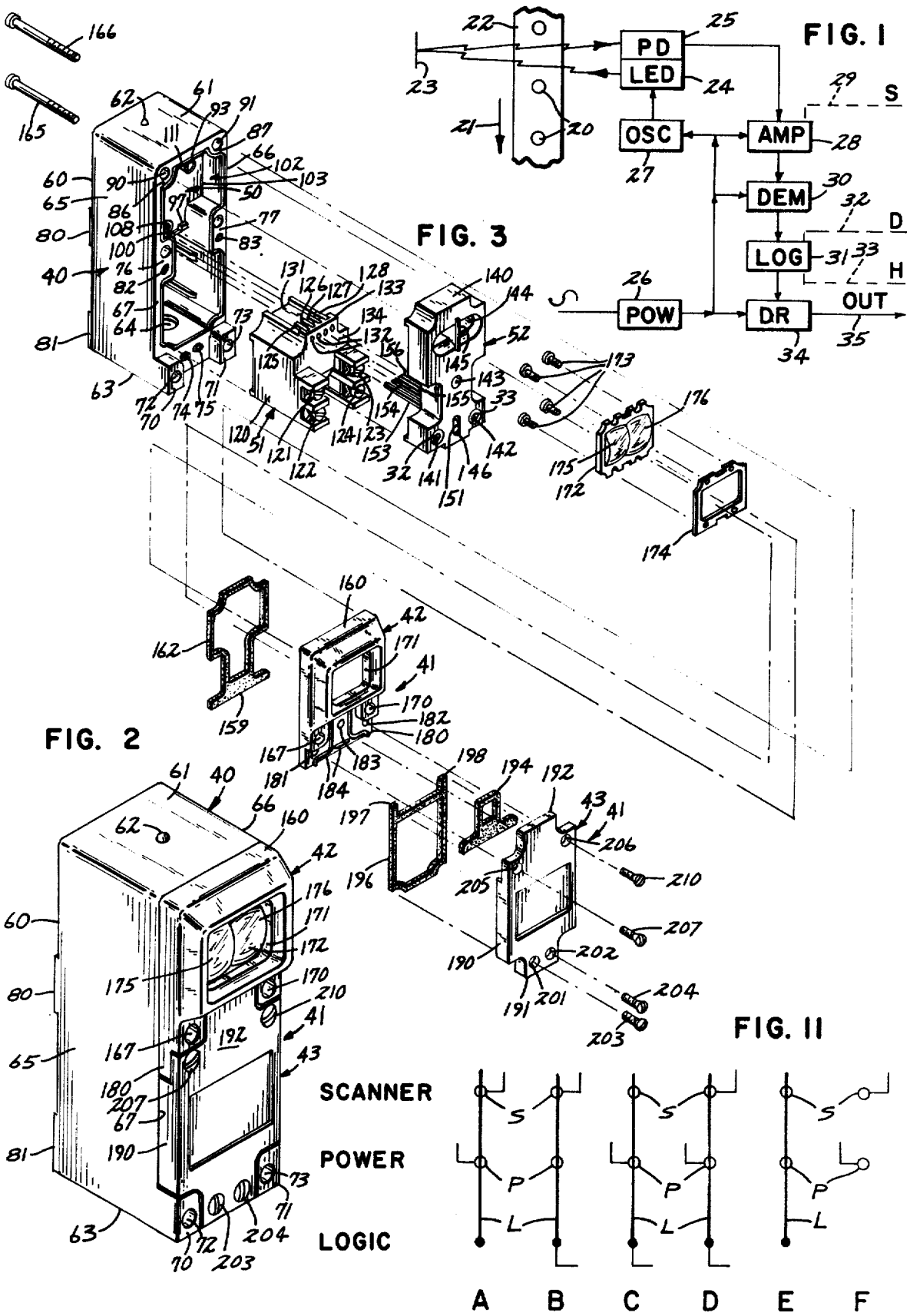

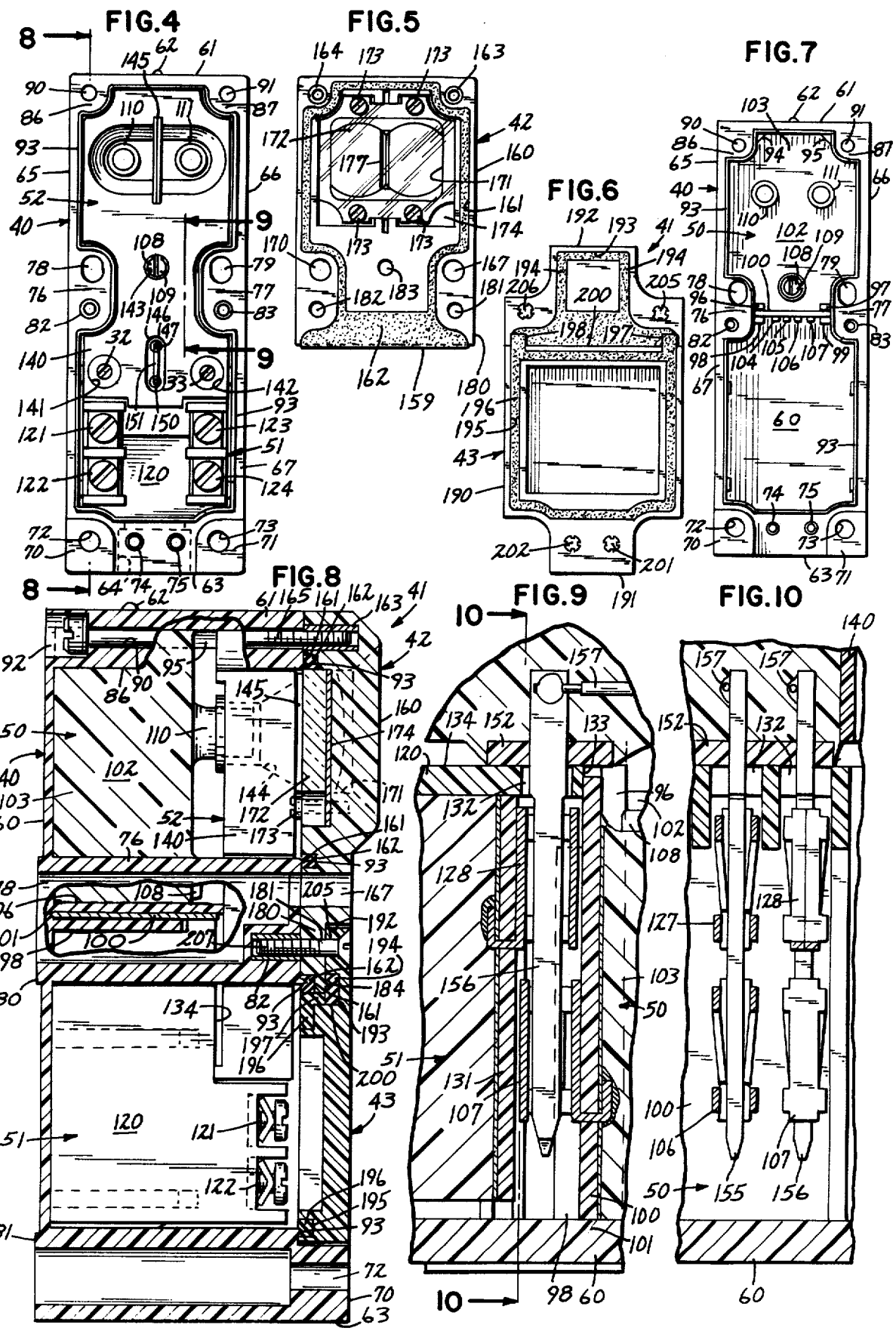

MODULAR PHOTOELECTRIC SWITCH

BACKGROUND OF THE INVENTION

This invention relates to the field of electrical engineering, and particularly to electrical controls or scanners for use in industrial systems. For the purpose of this application, a scanner may be defined as apparatus for initiating a control function in accordance with a light signal determined by a condition being observed or monitored. Simple examples of such conditions are the presence of a web in a gap, the presence of a registration mark on such a web, the continuous flow past a counting site of objects to be counted, and the movement of an object to be sprayed into a spraying zone.

Industrial applications of scanners have an environment of vibration and frequently of atmospheric moisture or inflammable or explosive vapors. Such scanners must be reliable over long periods of operation, must be capable of ready adjustment as to sensitivity and as to operational delay and hold times, and must be designed for rapid servicing when such servicing is needed, to avoid extended down-time of an industrial line. It is highly desirable that such devices also be so arranged that changes in the use of the line can be accommodated by substitution of interchangeable portions of the control, rather than by rewiring or removal of one control and substitution of another—a more lengthy and expensive process.

SUMMARY OF THE INVENTION

The present invention comprises an electrical control or scanner in which the selected components are potted into a plurality of circuit modules, three modules being illustrated. A first module is provided with a plurality of connector pins arranged as elements of a predetermined pattern, and other modules are provided with connector sockets also arranged as elements of the predetermined pattern, and are positioned in spaced alignment relation in a housing. Connections are made in each module to selected ones of the pins or sockets, and the pins are long enough to pass through the sockets of both of the other modules, so that interconnections are made automatically among the various modules simply by insertion of the first module into the housing, in accordance with which ones of the pins and sockets are connected to the various circuit points. Substitution of one "first" module for another can have the effect of changing the interconnections, if connections to the pins are different.

Various advantages and features of novelty which characterize my invention are pointed out with particularity in the claims annexed hereto and forming a part hereof. However, for a better understanding of the invention, its advantages, and objects attained by its use, reference should be had to the drawing which forms a further part hereof, and to the accompanying descriptive matter, in which there is illustrated and described a preferred embodiment of the invention.

BRIEF DESCRIPTION OF THE DRAWING

In the drawing,

FIG. 1 is a showing in block diagram form of one possible circuit usable in the practice of the invention;

FIG. 2 is a perspective view of a scanner embodying the invention;

FIG. 3 is an exploded view of the structure of FIG. 2;

FIG. 4 is a view in elevation of the scanner with a cover removed;

FIG. 5 is a view of the inner surface of a cover portion;

FIG. 6 is a view of the inner surface of a second cover portion;

FIG. 7 is a view of the housing of the scanner with other parts removed;

FIG. 8 is a sectional view generally along the line 8—8 of FIG. 4;

FIG. 9 is a fragmentary sectional view taken along the line 9—9 of FIG. 4, to a larger scale;

FIG. 10 is a fragmentary sectional view taken along the line 10—10 of FIG. 9;

FIG. 11 is a schematic illustration of an interconnecting principle used in the invention.

DESCRIPTION OF THE PREFERRED EMBODIMENT

Figure 12:
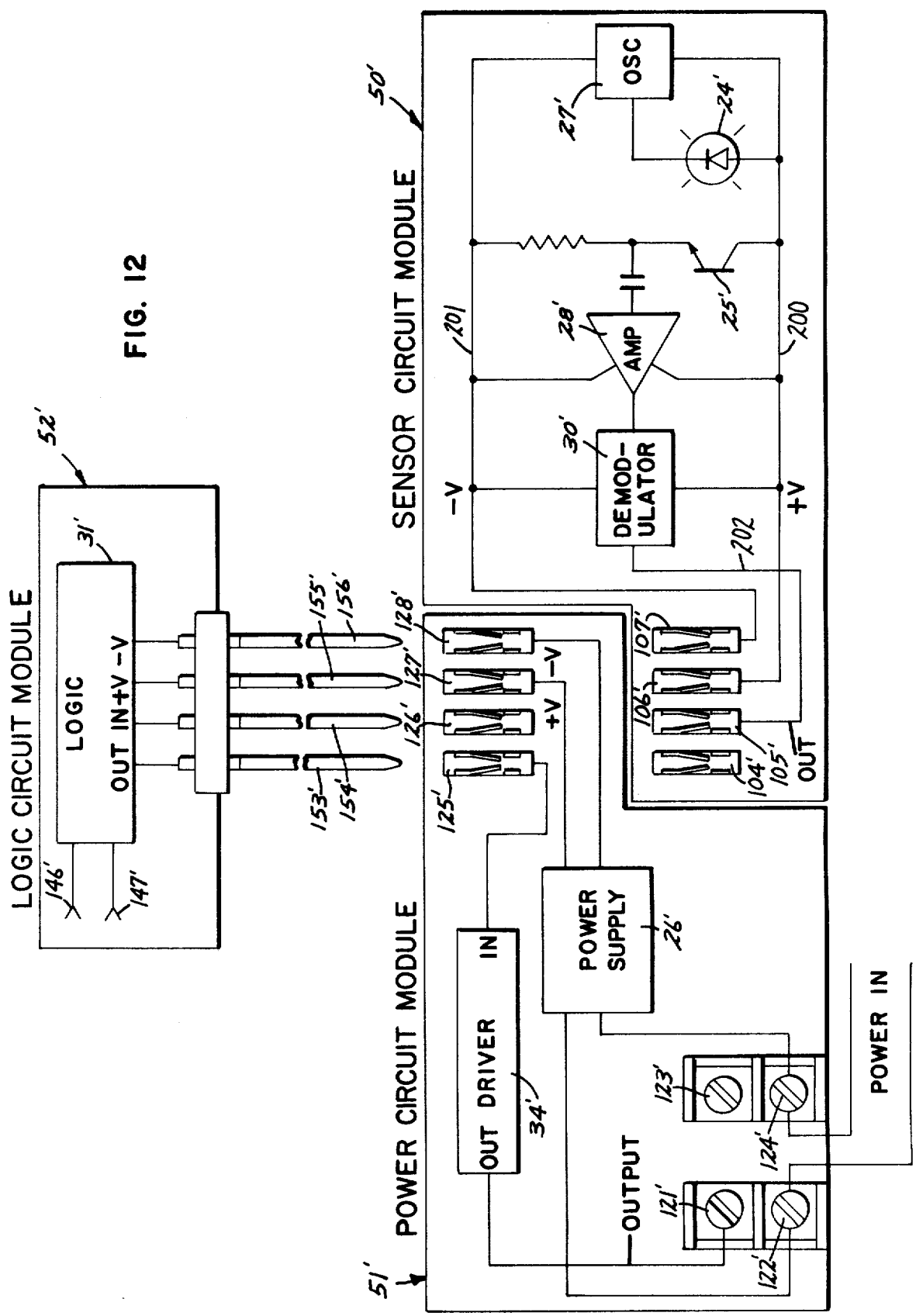
FIG. 12 is a block diagram of an actual embodiment of the invention.

FIG. 1 is a schematic showing one form of scanner adapted for use with my invention, and is presented for illustrative purposes only. Here a series of objects 20 to be counted moves in the direction of the arrow 21 on a suitable conveyor suggested at 22. An optical reflector 23 is located on one side of the conveyor to receive light from a source 24 such as a light emitting diode (L.E.D.) and reflect it to a light sensitive device 25 such as a photodiode. The light emitting diode is energized from a power unit 26 through an oscillator 27, and the photodiode output is fed through an amplifier 28 having a sensitivity adjustment 29, a demodulator 30, and a logic circuit 31 having a delay adjustment 32 and a hold adjustment 33, to a driver 34 for supplying an output 35 to actuate a remote counter, not illustrated. Logic circuit 31 is provided to enable the performance of such delay and hold functions as the nature of the application may require, these functions differing when the size of objects 20 is changed, for example.

My invention is directed to an arrangement by which elements 24-34 may be associated in logical relation and mounted for convenient, trouble free installation, use and maintenance. A scanner according to my invention is shown in perspective in FIG. 2 to comprise a molded housing 40 and a cover 41 having a first portion 42 and a second portion 43. FIG. 3 is an exploded view of this unit. It comprises housing 40, containing potted therein a sensor circuit module 50, a power circuit module 51, a logic circuit module 52, first cover portion 42, and second cover portion 43. Module 50 may contain components 24, 25 and 27-30 of FIG. 1, module 51 may contain components 26 and 34 of FIG. 1, and module 52 may contain components 31-33 of FIG. 1.

FIGS. 4 and 7 show that housing 40 has a generally flat bottom 60, a first end 61 into which is molded a translucent insert 62, a second end 63 with an aperture 64 tapped and threaded for mechanical connection to an electrical conduit, a pair of imperforate sides 65 and 66, and a generally flat top 67 above which project two corner posts 70 and 71. Mounting holes 72, 73 pass through housing 40 at posts 70, 71, and a pair of threaded inserts 74, 75 are located between posts 70 and 71. A pair of bosses 76, 77 project inwardly from sides 65, 66 and are traversed by a second pair of mounting holes 78, 79. Bottom 60 of housing 40 has mounting bosses associated with holes 78 and 72; two of these bosses are shown at 80, 81 in FIG. 8, respectively.

Bosses 76, 77 are further provided with threaded inserts 82, 83. The corners between end 61 and sides 65, 66 are reinforced at 86, 87, and holes 90, 91 pass through these reinforcements and are counterbored from below as indicated at 92 in FIG. 8. A narrow ridge 93 surrounds the inner edge of the ends and sides of the housing at its top, and a pair of spaced abutments 94 and 95 form a part of the corner reinforcements and terminate at a predetermined distance above bottom 60. Bosses 76, 77 are provided with a first pair of ribs 96, 97 rising from bottom 60 to the same distance as abutments 94 and 95, and with a second pair of ribs 98 and 99 spaced from ribs 96 and 97 by a predetermined amount, but rising from bottom 60 by a lesser distance.

A terminal board 100 is dimensioned to slide into housing 40 between ribs 96, 97 and ribs 98, 99, and seats in a groove 101 in bottom 60, to define a chamber 102 in which the various components of sensor circuit module 50 are secured by a potting compound 103 after being electrically interconnected, and being connected as the circuitry may require to all or selected ones of a plurality of sockets 104, 105, 106, and 107 carried by board 100. These sockets are located at the bottom of terminal board 100, and are arranged in a predetermined pattern, being in this case equally spaced in a straight line. Visible above the compound 103 are a variable resistor the sensor circuit adjustment 108 of 109 which functions as sensitivity adjustment 29, and a pair of tubular light shields 110 and 111 protecting diodes 24 and 25. It is understood that a suitable signal lamp may be potted into module 50 in a position where its light can be observed through insert 62, as an indication that the scanner is in operation.

As shown in FIG. 3, power circuit module 51 comprises a molded shell 120 into which the appropriate components are potted after being electrically connected to a set of screw terminals 121, 122, 123, and 124 and a set of sockets 125, 126, 127, and 128 carried on a terminal board 131 and positioned in the same pattern as sockets 104-107. Apertures 132 are provided in a projection 133 of shell 120 in the same pattern as, and in line with, sockets 125-128. The outline of shell 120 conforms to the shape of housing 40 between members 70, 71 and members 76, 77, and when module 51 is positioned in the housing apertures 132 and sockets 125-128 are directly above and in line with sockets 104-107 of module 50, as shown in FIG. 9. The surface 134 of shell 120 having projection 133 is at the same distance above bottom 60 as the tops of members 94, 95, 96 and 97: terminals 121-124 extend above this level.

Logic circuit module 52 comprises a molded hollow shell 140 shaped to fit in housing 40 and overlie sensor circuit module 50 and surface 134 of power circuit module 51, as shown in FIGS. 4 and 8. The module is shown as provided with recesses 141 and 142 to receive hold and delay adjustment devices 32 and 33, and has a generally central aperture 143 through which a screw driver may be passed to adjust member 109 in module 50 therebelow without requiring removal of module 52. A further aperture 144 is provided in line with members 110 and 111, which project somewhat thereinto from below, and a slightly outwardly projecting central baffle 145 mutually isolates members 110 and 111 within aperture 144. A recess 146 is provided with a pair of jacks 147 and 150 for receiving a jumper 151 where this is desired. A terminal board 152 is potted into shell 140 as shown in FIG. 9, and mounts a plurality of long connector pins 153, 154, 155, and 156, arranged in the same pattern as sockets 104-107 and 125-128 and located to be directly thereover, so that when module 52 is inserted into housing 41, the pins pass through the power circuit module sockets and into the sensor circuit module sockets. Components appropriate to the logic functions to be performed are potted into shell 140 and connected to the pins as suggested at 157.

Cover portion 42 comprises a molding 160 grooved at 161 to receive a resilient gasket 162 for engaging a portion of ridge 93 in sealing relation: gasket 162 extends slightly beyond the edge of molding 160, as at 159. Threaded inserts 163 and 164 in molding 160 are positioned to receive bolts 165 and 166 which secure cover portion 42 in aligned relation against housing 40 to accomplish the seal, as seen in FIGS. 2 and 8. When so positioned, a pair of apertures 167 and 170 in portion 42 are in line with mounting holes 78 and 79, and a relatively large aperture 171 is in line with aperture 144 and members 110 and 111. A lens 172 of clear plastic is secured in aperture 171 by screws 173 which clamp it against a sealing gasket 174: outwardly lens 172 comprises a pair of convex generally spherical protuberances 175 and 176, and inwardly it is provided with a groove 177 to mate with baffle 145. Molding 160 has a portion 180 of reduced thickness through which pass openings 181 and 182, aligned with inserts 82 and 83 in housing 40, and a further opening 183, aligned with opening 143 of logic circuit module 52 and with screw driver adjustment 109 of module 50. The outer surface of portion 180 has a ridge 184 like ridge 93.

Cover portion 43 comprises a molding 190. One end 191 of molding 190 is configured to fit between corner posts 70 and 71, and the other end 192, of reduced thickness, is configured to overlie surface 180 of molding 160. A groove 193 is formed in the inner surface of end 192 to receive a resilient gasket 194 shaped in conformity with ridge 184 of molding 160. A channel 195 is formed in the inner surface of molding 190 to receive a second resilient gasket 196 configured in accordance with a portion of ridge 93. Gasket 196 has a pair of extensions 197 and 198 which pass through grooves in the outer wall 200 of channel 95.

Apertures 201 and 202 are formed in end wall 191 of molding 190 to receive screws 203 and 204, and apertures 205 and 206 are formed in end 192 of the molding to receive screws 207 and 210. Portion 43 is so configured that when its inner surface is placed against housing 40 and cover portion 42, apertures 201 and 202 are in line with inserts 74 and 75 of the housing, and apertures 205 and 206 are in line with apertures 181 and 182 of portion 42 and with inserts 82 and 83 of housing 40. To accomplish this alignment, the protruding edge 159 of gasket 162 is compressed against wall 200, and projections 197 and 198 are compressed against the end of molding 160: when screws 203, 204, 207 and 208 are tightened and a conduit is connected in aperture 64, the scanner is completely sealed against entrance of liquid or vapor.

Reference should now be had to FIG. 11, which illustrates the various options available to the designer of modules 50, 51 and 52. In each option, a scanner circuit module socket is indicated at S, a power circuit module socket is illustrated at P, and a logic circuit module pin is indicated at L. In option A, no connection is made to pin L, which simply serves to interconnect points in the scanner and power circuit modules connected to sockets S and P. In option B, no connection is made to socket P (or that socket may be omitted), and pin L simply connects a point in the logic circuit module to a point in the scanner circuit module. In option C, no connection is made to socket S (or that socket may be omitted), and pin L simply connects a point in the logic circuit module to a point in the power circuit module. In option D, connections are made to the pin and to both sockets, so that a point in the scanner circuit module and a point in the power circuit module are connected to a common point in the logic circuit module. In option E, no connection is made to either socket (or both sockets are omitted), and the pin may be used as a tie point in the logic control module. Finally, in option F, no logic circuit pin is provided at all, and the sockets may be used as tie points in either the scanner or the power circuit modules, or in both modules.

OPERATION

Attention is now directed to FIG. 12, which illustrates the operation of my invention in one successful embodiment. In this figure, elements having primed reference numerals correspond to like elements with unprimed reference numerals in earlier figures. Scanner circuit module 50' is shown to comprise photodiode 24', light emitting diode 25', oscillator 27', amplifier 28', capacitance coupled to diode 25', and demodulator 30', all supplied with operating voltage on a positive bus 200 and a negative bus 201 connected to sockets 106' and 107', respectively: the output from demodulator 30' is supplied on a lead 202 connected to socket 105'. In this particular arrangement, no connection is made to socket 104'.

FIG. 12 also shows that in power circuit module 51' external power is supplied to screw terminals 122' and 124' and thence to power supply 26' which supplies operating voltage suitable to the components used at sockets 127' and 128'. Socket 126' has no connection in this arrangement. Socket 125' is connected to the input of driver 34', and the driver output is supplied to screw terminal 121'.

Logic circuit module 52' includes logic circuit 31' having an input connection to pin 154' and an output connection to pin 153', and receiving operating power at points connected to pins 155' and 156'.

When the modules are assembled, and input power is available positive voltage is supplied from socket 127' to pin 155' and hence to socket 106', and negative voltage is supplied from socket 128' to pin 156' and hence to socket 107', so that modules 50' and 52' are energized. The demodulator output 202 is supplied through socket 105' and pin 154' as an input to logic 31', socket 126' having no influence on this, and the output of logic circuit 31' is supplied on pin 153' to socket 125' and thence to driver 34', socket 104' having no influence on this. Driver 34' in this case is an NPN transistor which functions to in effect connect screw terminal 124' to screw terminal 121'. If a counter to be operated is connected to screw terminals 121' and 122', this results in energization of the counter once for each light signal sensed by diode 25'. By well known circuitry, the count can be caused to occur at choice by an increase of light at diode 25' or a decrease of light there. Circuits are known in which this choice may be implemented by inserting or omitting a jumper between a pair of jacks 146' and 147' connected to appropriate points in logic circuit 31'.

Numerous characteristics and advantages of my invention have been set forth in the foregoing description, together with details of the structure and function of the invention, and the novel features thereof are pointed out in the appended claims. The disclosure, however, is illustrative only, and changes may be made in detail, especially in matters of shape, size, and arrangement of parts, within the principle of the invention, to the full extent indicated by the broad general meaning of the terms in which the appended claims are expressed.

What is claimed is:

1. A modular electrical circuit comprising, in combination:

a power circuit module including a first plurality of connector sockets arranged as elements of a predetermined pattern, said module being adapted to supply an operating voltage and to accept an output signal at selected ones of said sockets;

a sensor circuit module including a second plurality of connector sockets arranged as elements of an identical predetermined pattern, said module being adapted to accept an operating voltage, and to generate a condition-responsive control signal, at selected ones of said sockets;

means mounting said modules so that said patterns are in spaced, aligned relation;

and a logic circuit module including a plurality of connector pins arranged as elements of a pattern identical with said predetermined pattern, said logic module being adapted to accept a control signal, and to supply an output signal, at selected ones of said pins, said pins being of length sufficiently greater than the space between said power circuit module and said sensor circuit module to enable their simultaneous engagement with sockets of both said modules, whereby to make electrical interconnections among all said modules in accordance with the location of said selected ones of said sockets and said pins, so that said operating voltage is supplied to said sensor circuit module, said control signal is supplied to said logic circuit module, and said output signal is supplied to said power circuit module.

2. A control according to claim 1 including a housing, means positioning said sensor circuit module in said housing, means removably positioning said power circuit module in said housing in partial overlying relation to said power module, and means removably positioning said logic circuit module in said housing in at least partial overlying relation to said power and sensor circuit modules.

3. A control according to claim 2 in which said logic circuit module is apertured to provide a passage for light extending to said sensor circuit module.

4. A control according to claim 2 in which said sensor module includes light sensitive means, and said logic circuit module is apertured to enable passage of light to said light sensitive means.

5. A control according to claim 2 in which said power circuit module includes further means, accessible without removal of said logic circuit module, for connecting to said control an external source of electrical power and an external device to be controlled.

6. A control according to claim 3 including a cover for said housing having a first cover portion adapted to admit light to said passage and a second cover portion partially overlying said first portion, means for securing said first cover portion in sealing relation to said housing, and means for securing said second cover portion in sealing relation to said housing and said first cover portion.

* * * * *